United States Statutory Invention Registration [19]

[11] Reg. Number: H512

Borgini et al. [43] Published: Aug. 2, 1988

[54] AUTOMATED UNIVERSAL ARRAY

[75] Inventors: Fred Borgini, Haddonfield; Richard Noto, Maple Shade, both of N.J.

[73] Assignee: The United States of America as represented by the Secretary of the Army, Washington, D.C.

[21] Appl. No.: 831,732

[22] Filed: Feb. 18, 1986

Related U.S. Application Data

[63] Continuation of Ser. No. 305,825, Sep. 28, 1981, abandoned.

[51] Int. Cl.[4] ..... H01L 27/04

[52] U.S. Cl. ..... 357/42; 357/23.7; 357/45; 357/23.13

[56] References Cited

U.S. PATENT DOCUMENTS

| | | | |
|---|---|---|---|
| 3,365,707 | 1/1968 | Mayhew | 357/41 |
| 3,749,614 | 7/1973 | Boleky, III et al. | 357/42 |
| 4,016,016 | 4/1977 | Ipri | 357/42 |
| 4,161,662 | 6/1979 | Malcolm et al. | 357/45 |
| 4,568,961 | 2/1986 | Noto | 357/40 |

OTHER PUBLICATIONS

Feller et al, U.S. Army Research and Development Technical Report DELET-TR-78-2960-1, Jun. 1979.

*Primary Examiner*—Stephen C. Buczinski
*Assistant Examiner*—Linda J. Wallace
*Attorney, Agent, or Firm*—Sheldon Kanars; Robert A. Maikis

[57] ABSTRACT

A large scale integrated semiconductor array consisting of a layout of predefined uncommitted active circuit components such as transistors which provide for logic function implementation and chip interfacing along with a region of passive circuit components used for signal and power routing. The various components are adapted to be interconnected on a single level which renders it particularly adaptable for automated layout techniques. The array is comprised of a plurality of rows of identical basic internal cells which are symmetrical and separated by an inner roadbed area consisting of at least three, but preferably five, vertical tunnel patterns, each of which is adapted to accommodate three horizontal wiring channels overhead for providing horizontal signal routing. Interconnection and vertical signal routing between cell rows can be made through a feedthrough in each internal cell and connection to selective vertical tunnels without touching the overhead horizontal wiring channels which provide horizontal signal routing. A side peripheral roadbed area adjoins the cell rows and inner roadbed area and consists of an alternating pattern of horizontal and vertical tunnels which permit interfacing with a bordering arrangement of peripheral cells consisting of basic peripheral cells and special purpose cells as well as providing coupling to a pair of common power busses which are located on the outer perimeter of the array.

20 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

AUTOMATED UNIVERSAL ARRAY

This application is a continuation of application Ser. No. 305,825, filed Sept. 28, 1981, now abandoned.

This invention relates generally to large scale integrated arrays of semiconductor devices and more particularly to a universal array of CMOS/SOS logic gates.

BACKGROUND OF THE INVENTION

Large scale integrated arrays of standard cells interconnected in various configurations are well known. Universal arrays of logic gates are also known and consist of a fixed placement of semiconductor logic devices and tunnels arranged in a repetitive ordered structure on a substrate typically silicon or sapphire. All device nodes (gates, drains, sources and tunnel ends) are accessible and by means of a metallization mask, a predetermined metallization pattern of interconnects is laid down for implementing a particular circuit configuration. Typical examples of this type of technology are shown and described in th following patents: (a) U.S. Pat. No. 3,365,707, entitled, "LSI Array and Standard Cells", issued Thomas R. Mayhew on Jan. 23, 1968; (b) U.S. Pat. No. 3,638,202, entitled, "Access Circuit Arrangement for Equalized Loading in Integrated Circuit Arrays", issued to Paul R. Schroeder on Jan. 25, 1972; and (c) U.S. Pat. No. 4,161,662, entitled, "Standardized Digital Logic Chip", issued to Robert B. Malcolm, et al on July 17, 1979.

While the various arrangements as shown and described in these references all have one thing in common, that is, an orderly uniform arrangement of standard logic cells with intermediate cross-over and cross-under power and data interconnects, they do not lend themselves to automatic layout techniques. This is due to the fact that the relative inaccessibility of the basic internal cells and the adjoining roadbed interconnect routing area do not lend themselves to an optimization of metal routing on a single level for interconnecting the devices in a particular logic configuration as desired by the circuit designer.

It is an object of the present invention, therefore, to provide an improvement in large scale integrated arrays fabricated on a semiconductor substrate.

It is a further object of the present invention to provide a universal array of uncommitted semiconductor devices having optimum pin accessibility.

Still a further object of the present invention is to provide an automatic universal array particularly adapted for automated layout techniques which is adapted to implement a single level of interconnects to a plurality of logic gates by an optimum routing pattern.

SUMMARY

These and other objects are achieved by means of a large scale integrated universal array designed for single level metal routing and compatibility with automatic layout techniques and comprises a layout having a generally rectangular inner region of uncommitted identical basic internal cells arranged in parallel horizontal rows separated by a plurality of, at least three, mutually separated vertical tunnel patterns of plural tunnel sets defining an inner roadbed area for making straight line or diagonal interconnects vertically between adjacent cell rows. An outer border of peripheral cells are located adjacent the cell rows with an intermediate side peripheral roadbed area consisting of alternating horizontal and vertical tunnel patterns being provided for making interconnects to the peripheral cells and coupling outlying bordering power busses to the internal cells. The vertical and horizontal tunnel patterns, moreover, define areas over which a plurality of spaced apart horizontal and vertical interconnect wiring channels, respectively, can be formed for facilitating horizontal and vertical signal routing. Each basic internal cell comprises a symmetrical four transistor logic gate having a two input gate function for providing a dual entry vertically on each side of the cell. Each basic cell additionally has a feedthrough capability permitting signals to pass through a particular cell row. The inner roadbed area in its preferred form consists of five tunnel patterns between cell rows permitting fifteen horizontal metal interconnect wiring channels, in groups of three, to be implemented between cell rows. The bordering peripheral cells are of a well known conventional design and comprise basic peripheral cells that can be used to interface off-chip and special peripheral cells which include high impedance devices, low impedance devices, diodes and special custom circuits The foregoing as well as other objects, features and advantages of the invention will become apparent from the following detailed description when taken in conjunction with the appended drawings which are identified as follows.

DESCRIPTION OF THE PREFERRED EMBODIMENT

Figure 1:
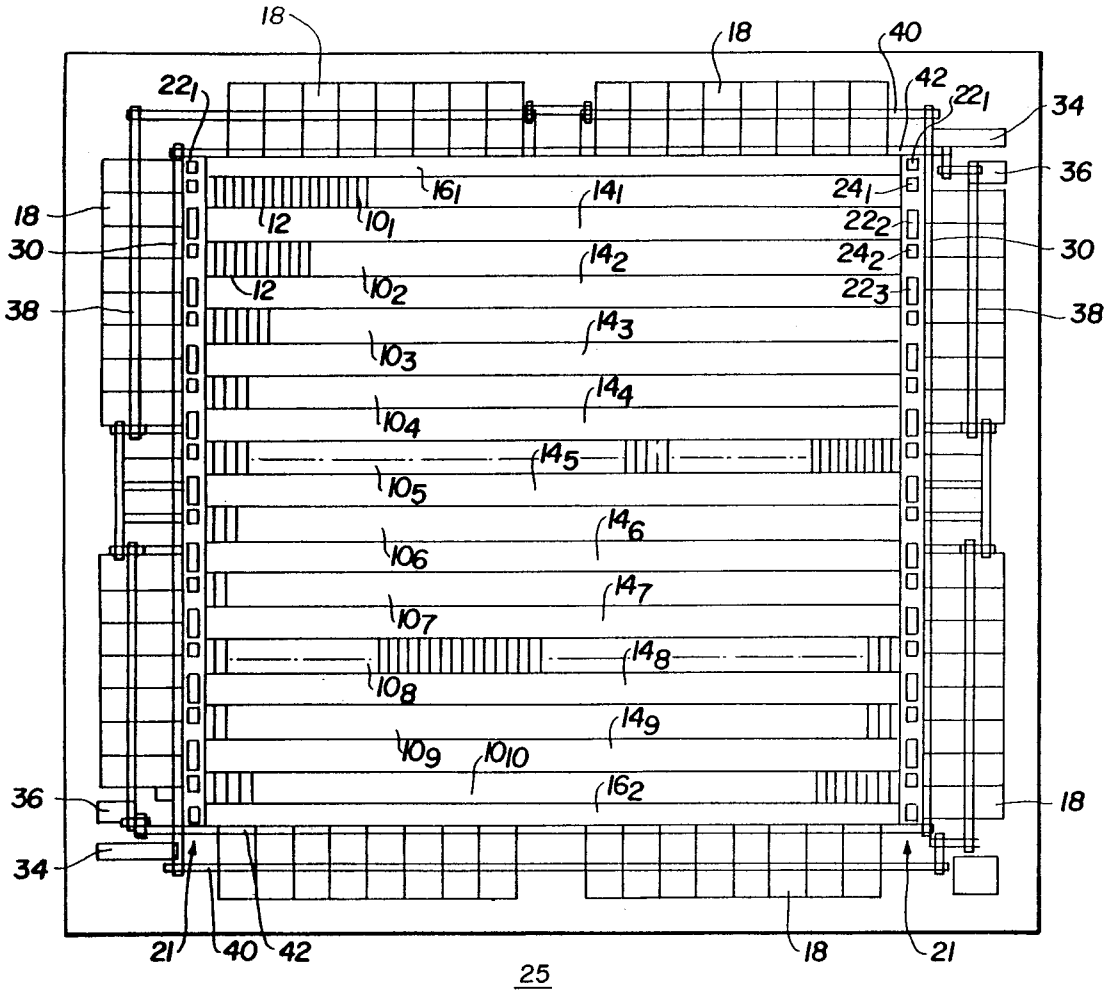
FIG. 1 is a plan view generally illustrative of the layout of the automatic universal array which comprises the subject invention.
Figure 2:
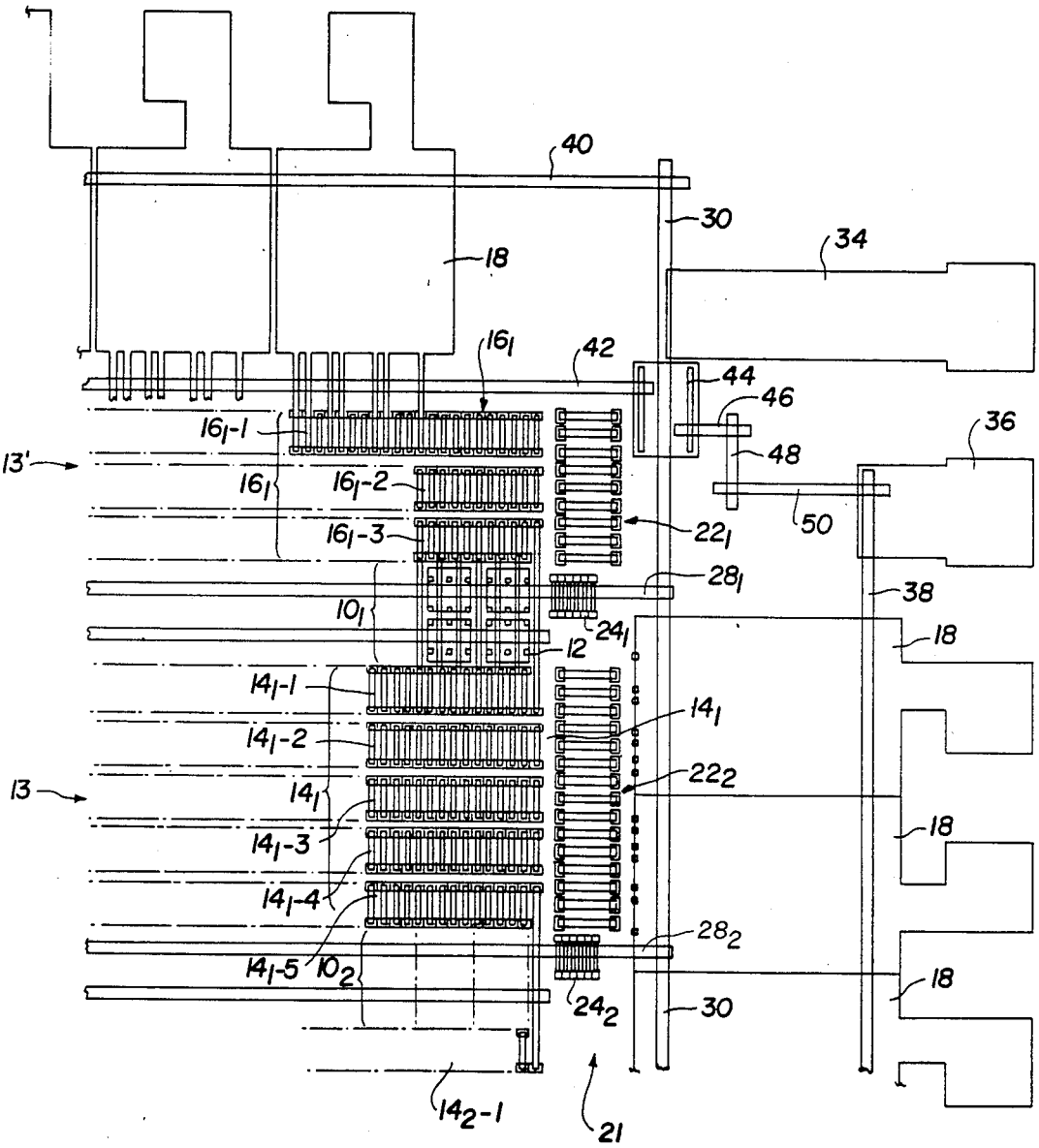
FIG. 2 is an enlarged sectional view of a portion of the layout shown in FIG. 1.

Referring now to the drawings wherein like numerals refer to like components throughout, reference is first made to FIGS. 1 and 2 wherein there is shown a layout and section therefrom generally illustrative of a universal array in accordance with the subject invention which, in its basic form, is comprised of: (a) a plurality (ten) of horizontal rows $\mathbf{10}_1$, $\mathbf{10}_2$ . . . $\mathbf{10}_{10}$ of identical contiguous basic internal cells 12 of which there are, for example, 64 per row; (b) an inner roadbed area (13) consisting of nine intermediate vertical polysilicon tunnel patterns $\mathbf{14}_1$, $\mathbf{14}_2$ . . . $\mathbf{14}_9$ between cell rows as well as an outer roadbed area 13' consisting of top and bottom end vertical polysilicon tunnel patterns $\mathbf{16}_1$ and $\mathbf{16}_2$ adjoining the first and last rows $\mathbf{10}_1$ and $\mathbf{10}_{10}$; (c) a bordering configuration of peripheral cells including basic and special peripheral cells 18; and (d) a side peripheral roadbed area 21 located at the right and left sides of the array providing an interface between the cell rows and peripheral cells and consisting of horizontal polysilicon tunnel patterns $22_1$, $22_2$ . . . $22_{11}$, respectively located adjacent the vertical tunnel patterns $16_1$, $14_1$ . . . $14_9$, and $16_2$, and with alternate relatively smaller polysilicon vertical tunnel patterns $24_1$, $24_2$ . . . $24_{10}$ located adjacent the ends of the respective cell rows $10_1$, $10_2$ . . . $10_{10}$.

The elements, moreover, are fabricated in the form of a chip 25 utilizing silicon on sapphire (SOS) techniques. A repetitive portion of the array shown in FIG. 1 is shown in greater detail in FIG. 2. Referring now to FIG. 2, the row $10_1$ of basic internal cells, for example, is located between the outer and top vertical tunnel pattern $16_1$ and the first inner vertical tunnel pattern $14_1$ which is intermediate the cell row $10_1$ and cell row $10_2$. As shown, the tunnel pattern $14_1$ and the other tunnel patterns $14_2$ . . . $14_9$ between cell rows consist of five sets of tunnels each while the outer vertical tunnel pattern $16_1$ is comprised of three sets of tunnels. More particularly, the tunnel pattern $14_1$ is comprised of five like numbered sets of equal length parallel tunnels $14_1$-1, $14_1$-2 . . . $14_1$-5 which are linearly arranged with one another and spaced equidistantly apart from one another. Likewise, the outer vertical tunnel pattern $16_1$ is comprised of three sets of tunnels $16_1$-1, $16_1$-2 and $16_1$-3.

As will become evident, the vertical tunnel patterns in the inner and outer roadbed areas 13 and 13' provide a number of discrete polysilicon tunnels which are adapted to encompass all available vertical wiring channels possible in the array while the horizontal tunnel patterns $22_1$, $22_2$, etc. in the side peripheral roadbed area 21 are adapted to encompass substantially all available horizontal wiring channels and interconnects between the internal rows of basic cells 12 and the peripheral cells 18. Additionally, the sets of alternating vertical tunnels $24_1$, $24_2$, etc in line with the horizontal tunnel patterns $22_1$, $22_2$, etc in the peripheral roadbed area provide cross-unders for plural vertical wiring channels and interconnects between the horizontal tunnel patterns $22_1$, $22_2$ allowing a power bus, for example the busses $28_1$, $28_2$, etc. to be coupled thereacross to the cell rows $10_1$, $10_2$, etc. The power busses $28_1$, $28_2$, etc., as shown in FIG. 2, connect to first vertical power bus 30 which connects to a bonding pad 34 in the corner of the array which is adapted to have, for example, a +V power potential applied thereto from off-chip. Immediately adjacent the bonding pad 34 is a second bonding pad 36 which is adapted to be connected to the opposite polarity power supply potential −V. The bonding pad 36 is connected to a second vertical power bus 38 which runs parallel to the power bus 30. Both power busses 30 and 38 are repeated on the other side of the array and run through the vertically aligned peripheral cells 18. The bonding pad 34 also connects to a first horizontal power bus 40 while the bonding pad 36 connects to a second horizontal power bus 42 by means of a bridge 44 over the power bus 30 and intermediate power bus segments 46, 48 and 50. As shown in FIG. 1, the same configuration is provided at the opposite diagonal corner of the array. Thus, both +V and −V power busses encircle the outer periphery of the array serving not only to power the peripheral cells 18 but also the internal cells 12 of the basic internal cell rows $10_1$, $10_2$ . . . $10_{10}$.

Figure 4:
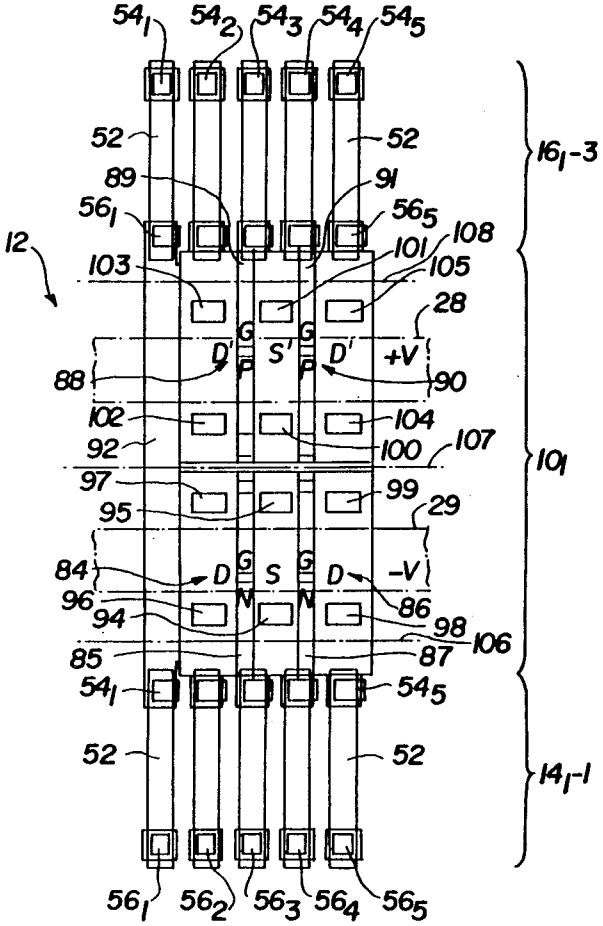
FIG. 4 is a diagram illustrative of the layout of one basic internal cell and the adjoining vertical tunnel pattern on either side thereof.
Figure 3:
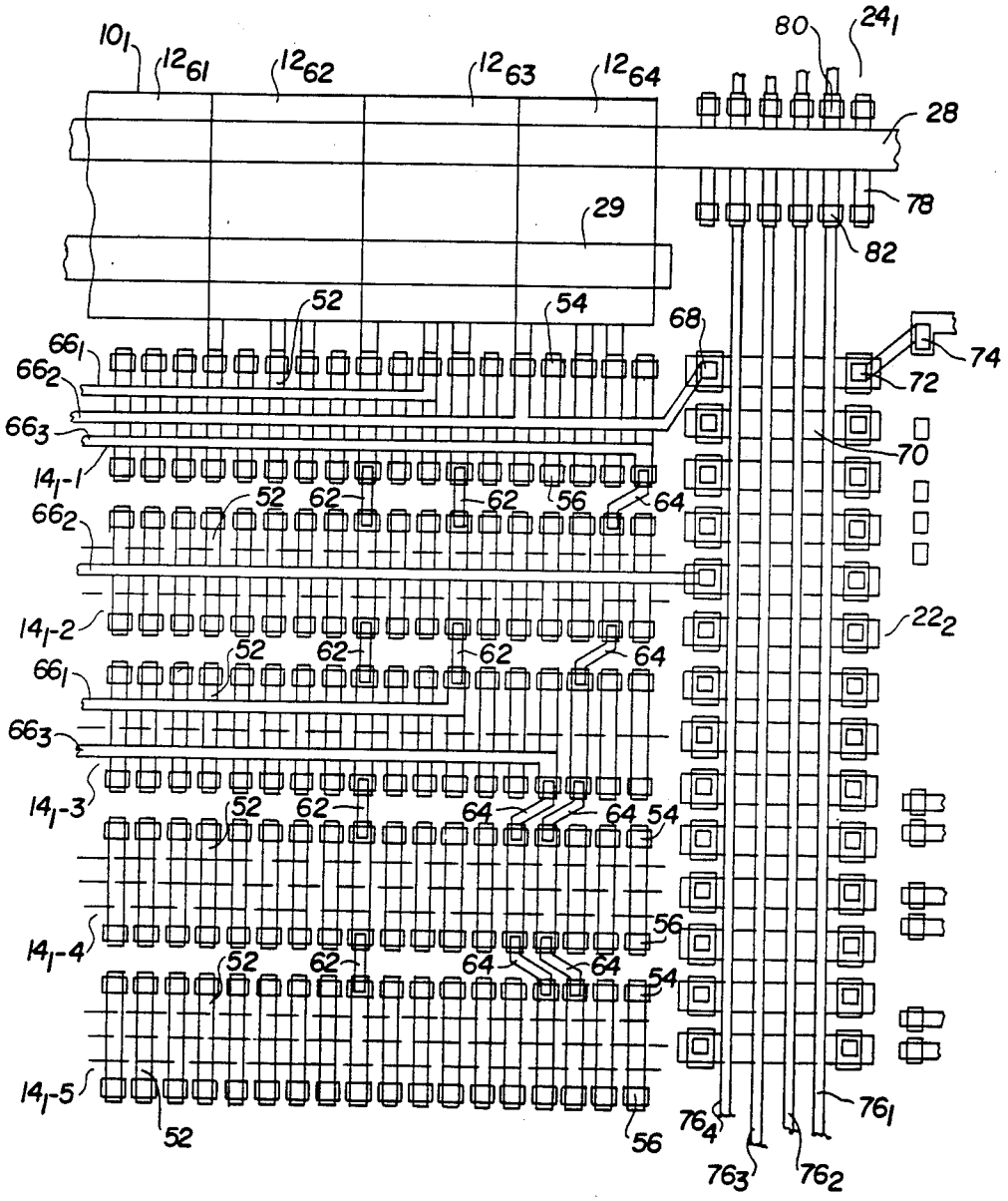
FIG. 3 is a diagram illustrative of the layout of the vertical and horizontal tunnel patterns in the inner and peripheral roadbed areas of the subject invention.

The inter-relationship between one inner vertical tunnel pattern e.g. tunnel pattern $14_1$ and its neighboring peripheral horizontal and vertical tunnel patterns $22_2$ and $24_1$ is further illustrated in FIG. 3. There the five sets of inner roadbed tunnels $14_1$-1. $14_1$-2, $14_1$-3, $14_1$-4 and $14_1$-5 between cell rows $10_1$ and $10_2$ are shown consisting of a plurality of identical polysilicon tunnels 52 which terminate in externally accessible metal contact pads or pins 54 and 56 at each end thereof. The upper contact pins 54 of the tunnel pattern $14_1$-1 are located immediately adjacent the lower side of cell row $10_1$ while the upper side thereof is adjacent the lower contact pins 56 of the outer roadbed tunnel pattern $16_1$-3. The significance of this arrangement will become apparent when FIG. 4 is considered.

With respect to the lower pins 56 of tunnel pattern $14_1$-1, they are spaced apart from a like number of upper contact pins 54 of the next tunnel pattern $14_1$-2. This vertical arrangement of spaced apart contact pins proceeds to a like number of contact pins 56 of the fifth tunnel pattern $14_1$-5 which is immediately adjacent cell row $10_2$. Thus, metallization contacts can be made from cell row to cell row through the tunnel vertical patterns by any number of vertical interconnects 62, diagonal interconnects 64, or horizontal metal channels 66, as shown.

The tunnel length of all the tunnels 52 of all the vertical tunnel patterns in the inner and outer roadbed areas 13 and 13' have a length of a predetermined vertical dimension so that one, two or three horizontal metal channels $66_1$, $66_2$ and $66_3$ can be over-laid as desired. These horizontal metal channels are adapted to primarily connect to selective vertical tunnel pins 54 or 56 for providing the desired logic routing within the array and accordingly to contact pins 68 of the outlying tunnels 70 of the horizontal tunnel pattern $22_2$. The horizontal tunnels 70 are repeated fifteen times in order to accommodate three horizontal channels per vertical tunnel pattern set which are adapted to overlay the five sets of tunnels $14_1$-1 . . . $14_1$-5. The horizontal tunnels 70 additionally include an outer contact pin 72 which is adapted, for example, to connect to a contact pin 74 of a peripheral cell, not shown. The horizontal width or length of the tunnels 70 are of a predetermined dimension to accommodate a mutual overlay pattern of up to four vertical metal channels $76_1$, $76_2$, $76_3$ and $76_4$. These four channels are adapted to be routed vertically through the adjacent vertical tunnel pattern $24_1$ consisting of a set of six vertical tunnels 78 having upper and lower contact pins 80 and 82 which are adapted to be connected to the four vertical channels $76_1$ . . . $76_4$ as well as the contact pins 72 and 68 of its immediately neighboring horizontal tunnel 70 of tunnel pattern $22_2$.

Thus, a unique single layer metallization pattern of both horizontal and vertical channels can be effected along with vertical or diagonal tunnel interconnects in a roadbed layout which is repetitive and provides an arrangement which is optimized for an automatic layout program produced, for example, by a computer which determines a particular connection of signal routing for implementing a predetermined logic configuration. The roadbed geometry shown in FIGS. 2 and 3 further provides a scheme whereby the internal cells 12 are sufficiently separated from the horizontal and vertical wiring channels without fear of shorting or cutting off access to a particular cell by crossing over or under it.

In addition to the layout of the inner, outer and side peripheral roadbed areas, of particular importance is the layout of the basic internal cells 12 which are repeated, for example, sixty-four (64) times per cell row. Referring now to FIG. 4, each basic internal cell 12 is located between five vertical tunnel contact pins, i.e the five contact pins 56hd 1, $56_2$ . . . $56_5$ of one set of tunnel patterns, for example, pattern $16_1$-3, as shown in FIG. 2, and five contact pins $54_1$, $54_2$ . . . $54_5$ of the vertical tunnel pattern $14_1$-1. The basic internal cell includes four CMOS transistors consisting of two N-type transistors 84 and 86 and two P-type transistors 88 and 90. In addition to the four transistors, a feedthrough tunnel 92 exists between the contact pins $56_1$ and $54_1$ to provide a feedthrough capacility which allows signals to pass unimpeded vertically through a particular cell row to another cell row. The P-type transistors 88 and 90 are formed by source and drain diffusions at the location of the +V power supply bus 28 while the N-type transistors 84 and 86 are formed by source and drain diffusions at the location of the horizontal −V power supply bus 29. The gates G of the two transistors 84 and 86 are dedicated to the lower pins $54_3$ and $54_4$ by way of polysilicon tunnel type members 85 and 87 while the gates of transistors 88 and 90 are dedicated to the upper pins $54_3$ and $54_4$ by way of polysilicon tunnel type members 89 and 91 to provide a two input dual entry into the cell. The remaining pins $54_2$, $54_5$ at the upper side of the cell and the pins $56_2$ and $56_5$ at the lower side of the cell are uncommitted so as to provide two contact pins at the top and bottom of the cell for selective connection of the drains and sources of the transistors 84, 86, 88 and 90. The two N-type transistors 84 and 86 share a common intermediate source region S which includes a pair of source contacts 94 and 95. The drain regions D of the transistors 84 and 86 include pairs of drain contacts 96, 97 and 98, 99. In a like manner, the common source region S′ of the two P-type transistors include a pair of contacts 100 and 101 which lie intermediate two pairs of drain contacts 102, 103 and 104, 105 for the drain regions D′. In addition, up to three internal horizontal wiring channels 106, 107 and 108 are provided as shown for making selective source and drain connections by metallizations, not shown. With such a configuration, the cell 12 is virtually symmetrical and is thus adapted for implementing a four transistor logic gate of any desired type having either a first or second vertical orientation with respect to the neighboring vertical tunnel patterns.

Figure 5:
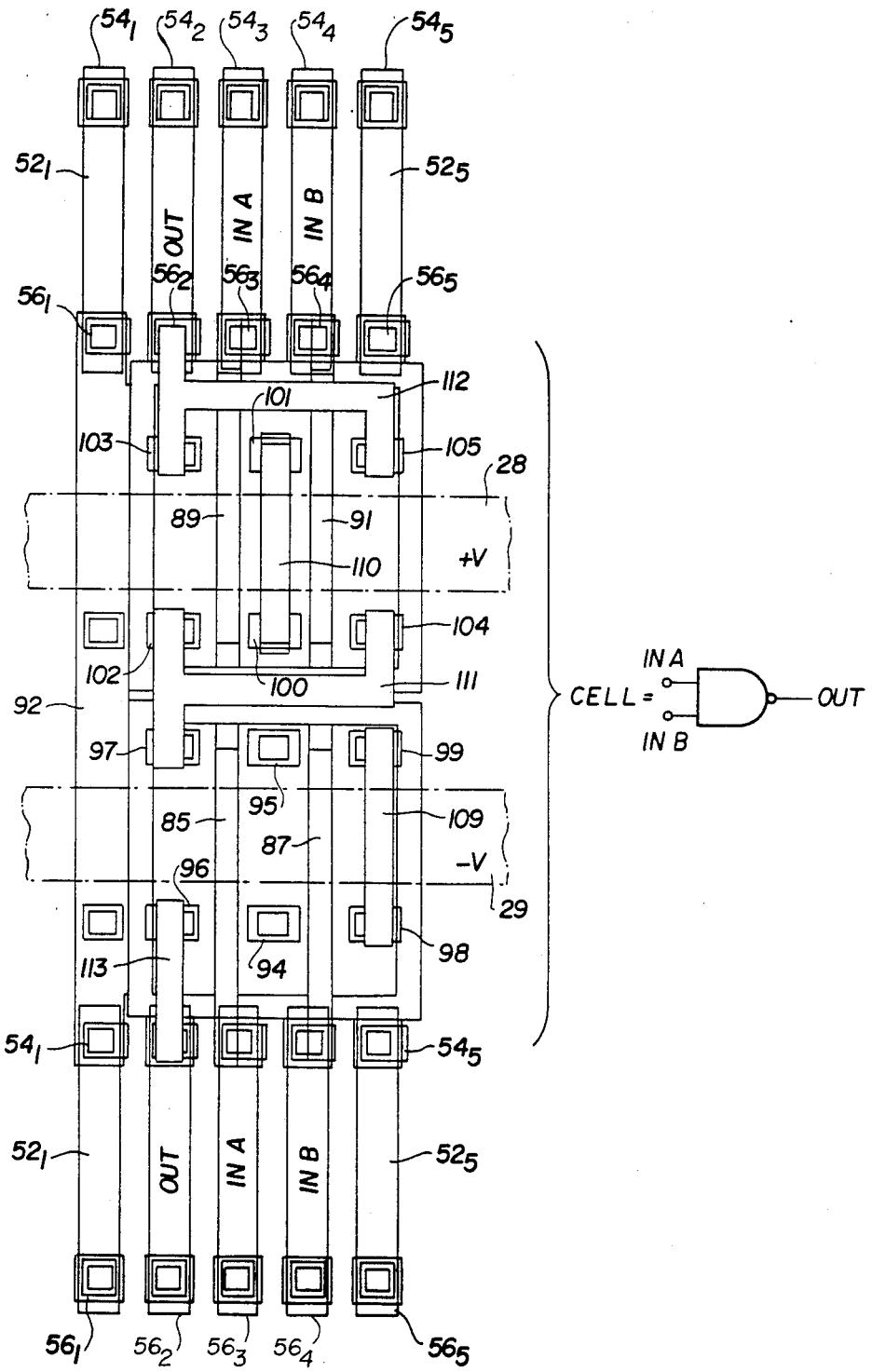
FIG. 5 is a diagram of the layout of a basic internal cell interconnected to function as a two input NAND gate.

In order to illustrate a typical logic gate formed from the basic internal cell layout shown in FIG. 4, reference is now made to FIG. 5 which discloses the implementation of a dual input NAND gate which can be accessed from either the top or bottom side of the cell 12. In addition to the underlying polysilicon tunnels 85, 87, 89 and 91 for the gates of transistors 84, 86, 88 and 90, whereby an input A can be applied to either pin $54_3$ or $56_3$ while the other input B can be applied either at pin $54_4$ or $56_4$, the NAND gate as shown requires a vertical metal channel connection 109 between the drain contacts 98 and 99, a vertical metal channel connection 110 between the source contacts 100 and 101, a horizontal and vertical metal channel connection 111 between the drain contacts 97, 102 and 104, a horizontal and vertical metal channel connection 112 spanning the polysilicon gate terminals 89 and 91 between the drain contacts 103 and 105 as well as the contact pin $56_2$ and finally a vertical metal channel connection 113 between the drain contact 96 and the pin $54_2$. All of the metal interconnections are adapted to be made at the same outermost level of the chip along with signal routing interconnections being made at the same level in the roadbed area. This can be done by a single mask defining the various connections and laying down metallization in a manner well known to those skilled in the art. Typically, this involves etching away of metal at all points at locations where metal is not wanted.

Figure 6A:
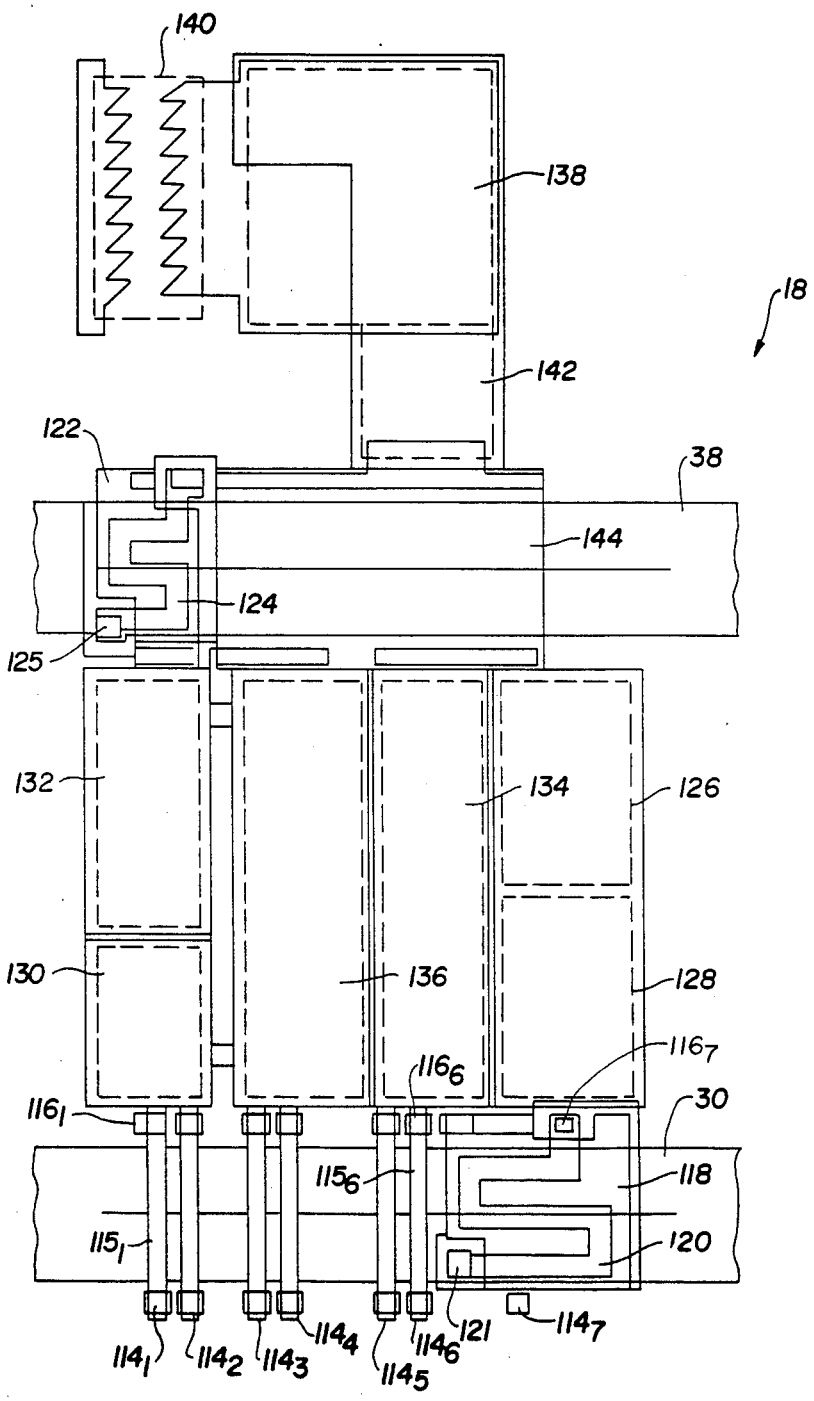
FIGS. 6A and 6B are a generalized layout and diagram of the component parts of a basic peripheral cell utilized in the subject invention.
Figure 6B:
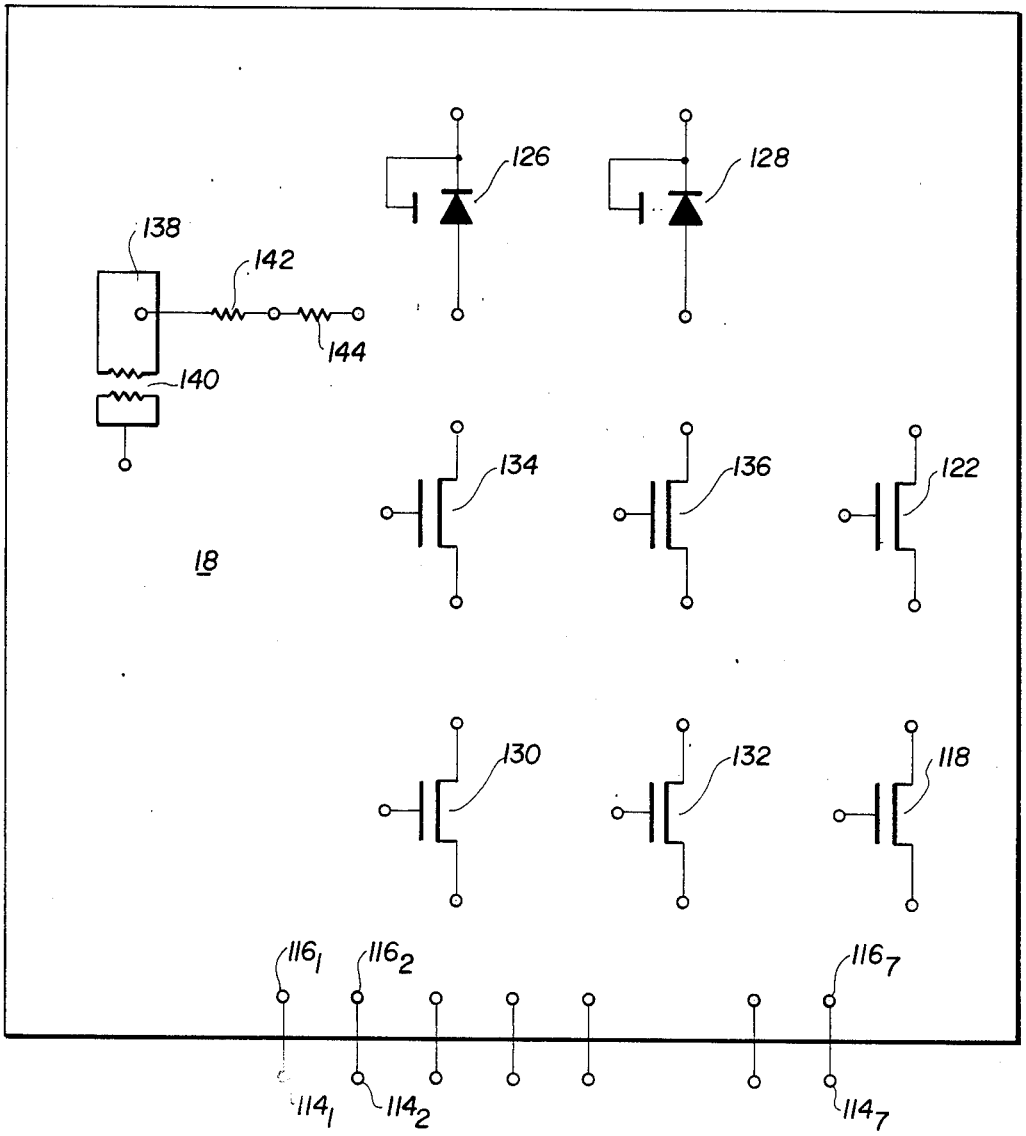

With respect to the peripheral cells that are used to interface the internal cell configuration to external off-chip circuitry, not shown, a typical basic peripheral cell 18 is shown in layout form in FIG. 6A, whereas FIG. 6B is intended to illustrate the various semiconductor devices incorporated therein. Each basic peripheral cell 18 includes seven access contact pins $114_1$ . . . $114_7$, six of which connect to tunnels $115_1$ . . . $115_6$ over which a power bus, for example, bus 30 is found. The tunnels $115_1$ . . . $115_6$ terminate at internal contact pins $116_1$ . . . $116_6$. A seventh internal contact pin $116_7$ is shown connected to a high impedance device 118 which includes a serpentine element 120 coupled to the power bus 30 at the pad 121. On the other side of the cell, a second high impedance device 122 including the serpentine element 124 is located over the power bus 38 and connects thereto via the pad 125. Intermediate the power busses 30 and 38 diffusions are made to implement a pair of gated diodes 126 and 128, two N-type transistors 130 and 132 and two P-type transistor 134 and 136. On the other side of the power bus 38, there is located a bonding pad element 138 for providing an off-chip connection as well as a spark gap protective device 140. Also in the region of the bonding pad 138, there is located a first resistor 142 and a second resistor 144 which spans the power bus 38. Adjacent the bonding pad 138 is a protective spark gap 140.

FIG. 6B is schematically illustrative of these components in unconnected form. The specific implementation of interconnection of the devices in the peripheral cell 18, as shown in FIGS. 6A and 6B, follows the same principles as those associated with the metal interconnects or channels used to provide a specific logic gate configuration and therefore need not be discussed further, inasmuch as a circuit designer will make a specific implementation depending upon the specific needs of the user. Additionally, other special peripheral cells, the details of which are not shown, may include other high impedance devices, low impedance drivers, and special custom circuits as required in the specific circuit design.

Accordingly, what has been shown and described is a pattern of predefined uncommitted active components and roadbed areas which permit a selected logic application to be implemented at the outermost metallization level and which is capable of being laid out automatically, for example, by automatic layout programs contained in a computer. To design a logic chip using this technique, the designer functionally defines the circuit to be generated in terms of logic cells from a library of specially designed cells contained in the computer memory. Each cell consists of a metal interconnect pattern which, when superimposed in a proper position on the universal array shown and described herein, will generate a mask for connecting the underlying fixed devices and thus produce the desired logic function.

Having thus shown and described what is at present considered to be the preferred embodiment of the invention, it should be noted that the foregoing has been made by way of illustration and not limitation and accordingly all alterations, modifications and changes coming within the spirit and scope of the invention are herein meant to be included.

We claim:

1. A universal array of active and passive circuit components formed on a semiconductor chip and adapted for single level interconnection to provide a desired circuit implementation, comprising in combination:

plural first direction rows of identical symmetrical inner cells of uncommitted circuit components;

a bordering configuration of peripheral cells for providing an off-chip interface;

a first roadbed area on each side of said plural rows of inner cells, said first roadbed area having a second direction tunnel pattern including at least three sets of plural parallel conductive tunnels mutually spaced apart in said second direction for permitting first and second type interconnections between adjacent tunnel sets for second direction signal routing within the array and having respective predetermined conductive tunnel lengths permitting plural parallel first direction conductive wiring channels crossing thereover for first direction signal routing within the array;

a second roadbed area at each end of said plural rows of inner cells as well as said first roadbed area, said second roadbed area having a first direction tunnel pattern adjacent each first roadbed area and including a set of plural parallel first direction conductive tunnels and having respective predetermined tunnel lengths permitting plural parallel second direction conductive wiring channels crossing thereover for second direction signal routing within the array, and a second direction tunnel pattern adjacent each row of inner cells and aligned with said first direction tunnel pattern and including a set of plural parallel second direction conductive tunnels for selective connection of said second direction conductive channels of said first direction tunnel pattern and having respective predetermined tunnel lengths permitting at least one first direction conductive wiring channel crossing thereover; and a pair of peripheral power busses connecting opposite polarity potentials to said plurality of inner and peripheral cells, said power busses running parallel and spaced across said peripheral cells around four sides of said array and including a plurality of branch busses in said first direction connected to respective power busses and crossing over said second direction tunnel pattern adjacent each row of inner cells and running through said array for applying said opposite polarity potentials to said plural first direction rows of inner cells, a pair of bonding pads at one corner for connecting an external power source to respective said power busses, and a bridge over one power buss for connecting the other power buss to one bonding pad while maintaining separation from the one buss and the other bonding pad, said peripheral cells each including a plurality of tunnels crossing under one said power buss and providing connections between said peripheral cells and inner cells, a further bonding pad for connection to external circuit means, and a pair of high impedance devices connected between said power busses and said peripheral cells.

2. The universal array as defined by claim 1 wherein said first direction comprises the horizontal direction and said second direction comprises the vertical direction.

3. The universal array as defined by claim 1 wherein said first roadbed area between rows of cells consists of a tunnel pattern including five sets of second direction tunnels.

4. The universal array as defined by claim 3 wherein the second direction spacing between said five sets of conductive tunnels is substantially equal.

5. The universal array as defined by claim 4 wherein second direction spacing is less than the respective predetermined tunnel lengths.

6. The universal array as defined by claim 5 wherein the respective tunnel lengths of said five sets of conductive tunnels are substantially equal.

7. The universal array as defined by claim 6 wherein the widths of the individual tunnels of said five sets of tunnels are substantially equal and less than their respective lengths.

8. The universal array as defined by claim 6 wherein the lengths of said conductive tunnels of said second direction pattern of said second roadbed area are substantially equal to the tunnel lengths of said five sets of conductive

9. The universal array as defined by claim 8 wherein the widths of the conductive tunnels of said first direction tunnel pattern of said second roadbed area are greater than the widths of the conductive tunnels of said second direction tunnel pattern of said second roadbed area.

10. The universal array as defined by claim 1 wherein each cell of said plural rows of cells laterally spans an equal number of second direction conductive tunnels of one of said at least three sets of tunnels of said first roadbed area on opposite sides of said cell.

11. The universal array as defined by claim 10 wherein each of said equal number of second direction conductive tunnels terminates in a respective pair of conductive contact pads or pins, one of which is located adjacent said cell and one of which is located a tunnel length away from said cell.

12. The universal array as defined by claim 11 wherein each cell includes a feedthrough conductive tunnel connected to one adjacent contact pad on opposite sides of said cell.

13. The universal array as defined by claim 11 wherein each cell comprises a plurality of active semiconductor devices for implementing a logic gate, said devices respectively having an input terminal coupled to individual contact pads of said adjacent contact pads.

14. The universal array as defined by claim 13 wherein each said cell includes four semiconductor devices two of which are located on respective opposite halves of said cell and wherein said four devices have respective input terminals coupled to two individual contact pads on opposite sides of said cell.

15. The universal array as defined by claim 14 wherein said semiconductor devices comprise transistors.

16. The universal array as defined by claim 15 wherein said two transistors on opposite halves of said cell are respectively of opposite semiconductivity type.

17. The universal array as defined by claim 15 wherein two of said transistors comprise N-type transistors and two of said transistors comprise P-type transistors.

18. The universal array as defined by claim 15 wherein said transistors include gate, drain and source diffusion regions and wherein said gate regions are common to said input terminals.

19. The universal array as defined by claim 14 wherein said equal number of second direction conductive tunnels comprise five conductive tunnels on opposite sides of said cell and wherein said respective input terminals are coupled via respective polysilicon tunnels to two individual contact pads of said five tunnels on opposite sides of said cell and wherein said cell additionally includes a polysilicon feedthrough conductive tunnel connected at opposite ends to another contact pad of said five tunnels on opposite sides of said cell.

20. The universal array as defined by claim 19 wherein said semiconductor devices comprise three terminal devices one of which comprises said input terminal and wherein the two remaining terminals are adapted to be selectively coupled via metals interconnects to the remaining contact pads of said five conductive tunnels on opposite sides of said cell.

* * * * *